US008302041B1

(12) United States Patent
Chan et al.

(10) Patent No.: US 8,302,041 B1
(45) Date of Patent: Oct. 30, 2012

(54) IMPLEMENTATION FLOW FOR ELECTRONIC CIRCUIT DESIGNS USING CHOICE NETWORKS

(75) Inventors: Vi Chi Chan, Hong Kong (HK); Tetse Jang, San Jose, CA (US); Kevin Chung, Toronto (CA); Taneem Ahmed, Toronto (CA); David Nguyen Van Mau, Syssinet (FR); Mehrdad Parsa, Santa Cruz, CA (US); Amit Singh, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 1149 days.

(21) Appl. No.: 12/146,313

(22) Filed: Jun. 25, 2008

(51) Int. Cl.
    *G06F 17/50* (2006.01)
(52) U.S. Cl. ........ 716/104; 716/116; 716/122; 716/129; 716/130; 716/132; 716/123
(58) Field of Classification Search .................. 716/104, 716/116, 122, 123, 129, 130, 132
    See application file for complete search history.

(56) References Cited

U.S. PATENT DOCUMENTS

| | | | | |
|---|---|---|---|---|
| 5,841,663 | A | * | 11/1998 | Sharma et al. ............... 716/104 |
| 6,324,671 | B1 | * | 11/2001 | Ratzel et al. ................. 716/103 |
| 6,477,683 | B1 | * | 11/2002 | Killian et al. ................ 716/106 |
| 7,171,633 | B1 | * | 1/2007 | Hwang et al. ................ 716/103 |
| 7,587,687 | B2 | * | 9/2009 | Watanabe et al. ............ 716/104 |
| 2007/0157131 | A1 | * | 7/2007 | Watanabe et al. ................ 716/3 |
| 2008/0005707 | A1 | * | 1/2008 | Papanikolaou et al. .......... 716/4 |
| 2008/0250360 | A1 | * | 10/2008 | Willis ............................. 716/2 |
| 2011/0154278 | A1 | * | 6/2011 | Caldwell et al. .............. 716/103 |
| 2011/0154279 | A1 | * | 6/2011 | Caldwell et al. .............. 716/103 |

OTHER PUBLICATIONS

Chen, Deming, et al.; "DAOmap: A Depth-Optimal Area Optimization Mapping Algorithm for FPGA Designs"; Copyright 2004 IEEE; pp. 752-759.
Mishchenko, Alan, et al., "Improvements to Technology Mapping for LUT-Based FPGAs"; IEEE Transactions on Computer-Aided Design of Integrated Circuits and Systems; vol. 26, No. 2; Feb. 2007; pp. 240-253.
Chatterjee, S. et al., "Reducing Structural Bias in Technology Mapping", ICCAD 2005, 9 pages.
Lai, Y.T. et al. "BDD based decomposition of logic functions with applications to FPGA synthesis", $30^{th}$ ACM/IEEE DAC 1993, pp. 642-647.
Zhang, J., et al., "Symmetry Detection for Large Boolean Functions using Circuit Representation, Simulation and Satisfiability", DAC 2006, Jul. 24-28, 2006, San Francisco, CA, 6 pages.
Sigl, G., et al., "Analytical Placement: A Linear or a Quadratic Objective Function", $28^{th}$ ACM/IEEE DAC, 1991, Paper 25.2, pp. 427-432.

(Continued)

*Primary Examiner* — Phallaka Kik
(74) *Attorney, Agent, or Firm* — Kevin T. Cuenot (57) ABSTRACT

A computer-implemented method of implementing a circuit design that includes an initial network within a programmable logic device can include generating a first choice network from the circuit design according to a first synthesis technique and determining a placement for the first choice network. At least a second choice network can be generated from the first choice network according to a second synthesis technique. A placement for the second choice network can be determined. The placement for the first choice network can be compared with the placement for the second choice network. A placement and corresponding choice network can be selected according to the comparison, and output.

20 Claims, 2 Drawing Sheets

OTHER PUBLICATIONS

Kleinhans, J.M., et al., "GORDIAN: VLSI Placement by Quadratic programming and Slicing Optimization", IEEE Transaction on CAD, pp. 356-365, 1991.

Manohararajah, V., et al., "Heuristics for Area Minimization in LUT-Based FPGA Technology Mapping", TCAD, Nov. 2006; pp. 2231-2340.

Mischenko, R., et al., "SAT-based Logic Optimization and Resynthesis", Proc. IWLS, May 2007, pp. 358-364.

Kudva, P., et al., "Metrics for structural logic synthesis", ICCAD, pp. 551-556, Nov. 2002, 6 pages.

Anderson, J., et al., "Power-Aware Technology Mapping for LUT-Based FPGAs", IEEE Intl. Conf. on Field Programmable Technology, 2002, pp. 211-218.

Zhu, Qi, et al., "SAT Sweeping with Local Observability Don't-Cares", DAC 2006, Jul. 24-28, 2006, San Francisco, CA, 6 pages.

* cited by examiner

IMPLEMENTATION FLOW FOR ELECTRONIC CIRCUIT DESIGNS USING CHOICE NETWORKS

FIELD OF THE INVENTION

The embodiments disclosed herein relate to integrated circuit devices (ICs). More particularly, the embodiments relate to implementation flows for ICs that incorporate choice networks.

BACKGROUND

Software-based Electronic Design Automation (EDA) tools, in general, can process circuit designs through what is referred to as an implementation flow. Processing the circuit design through an implementation flow prepares the circuit design for implementation within a particular integrated circuit (IC). A typical implementation flow entails various processes such as synthesis, technology mapping, placing, and routing. In the case of a programmable logic device (PLD) such as a field programmable gate array (FPGA), the resulting circuit design can be transformed into a bitstream that, when loaded into an IC (the target device), configures the target device to implement the circuit design.

Synthesis generally refers to the process of converting a hardware description language (HDL) description of a circuit design into a low-level implementation of the circuit design using logic gates. A programmatic circuit design written in an HDL can be compiled into a gate level description. Technology mapping generally refers to the process of associating the logic gates of the synthesized circuit design with physical circuit components available on the target device, e.g., memory, look-up tables, etc. The resulting circuit design can be specified in terms of components available on the target device rather than in terms of more primitive logic gates.

Placement generally refers to the process of assigning the technology mapped circuit components to actual locations on the target device. Routing generally refers to the process of linking the placed circuit components with wires or appropriate interconnect circuitry to facilitate communication and signal exchange among the components. These steps may be performed whether the circuit design is to be implemented within an application specific integrated circuit (ASIC) or a PLD.

Some implementation flows apply each process in serial. The decisions made within an earlier process, such as synthesis, will influence the decisions and results obtained during later processes, e.g., placement and/or routing. Processes that occur earlier within an implementation flow try to predict the decisions that will be made during later processes in an attempt to make the correct or optimal implementation decision(s). Each process typically makes decisions according to various costs relating to a design objective, e.g., timing, area usage, power consumption, or the like. The metrics used, however, have proven to be ineffective in determining the overall quality of the resulting circuit implementation. In other words, metrics that indicate the "goodness" of a logical network are often not particularly good indicators of the quality or goodness of the resulting physical circuit implementation.

Other implementation flows incorporate feedback mechanisms. Feedback mechanisms, however, still rely upon metrics applied to the logical network that may or may not serve as reliable indicators of a quality physical circuit implementation. Accordingly, despite the improvements obtained through the use of feedback mechanisms, many circuit designers still find randomization tools useful. A randomization tool processes the circuit design through multiple implementation flows. During each implementation flow, the randomization tool varies some aspect or implementation parameter(s) of one or more processes of the implementation flow in an attempt to explore alternate implementations of the circuit design. Often, the randomization tool is able to improve upon the circuit implementation, which demonstrates the often loose correlation that exists between measures of goodness of a logical network and goodness of the resulting physical circuit implementation. However, randomization tools typically require significant time to complete execution, which limits their usefulness. For example, a randomization tool often may operate overnight or over several days to explore different implementations of a circuit design.

The present invention may address one or more of these issues.

SUMMARY

The embodiments disclosed herein relate to implementation flows for integrated circuits, such as programmable logic devices (PLDs), that utilize choice networks. One embodiment of the present invention can include a computer-implemented method of implementing a circuit design within a PLD that includes or specifies an initial network. The method can include generating a first choice network from the circuit design according to a first synthesis technique and determining a placement for the first choice network. The method also can include generating at least a second choice network from the first choice network according to a second synthesis technique and determining a placement for the second choice network. The placement for the first choice network can be compared with the placement for the second choice network. A choice network can be selected according to the comparison. The selected choice network can be output.

The computer-implemented method also can include routing the selected choice network. Further, a detailed placement can be performed upon the selected choice network. In another embodiment, information generated by a process of an implementation flow can be prevented from being used during a repetition of a prior process of the implementation flow.

Determining a placement for the first choice network can include processing the first choice network through an analytical placement technique and generating placement results for comparison. Determining a placement for the second choice network can include processing the second choice network through an analytical placement technique and generating placement results for comparison.

Generating the first choice network can include adding at least one alternate circuit implementation to the initial network as a choice node. Generating the second choice network can include adding at least one additional alternate circuit implementation to the first choice network as a choice node.

Another embodiment of the present invention can include a computer-implemented method of implementing a circuit design within a PLD, including generating a plurality of lossless choice networks, generating placement information for each of the plurality of lossless choice networks, and comparing the placement information for each of the plurality of lossless choice networks. One of the lossless choice networks can be selected according to the placement information. The selected choice network can be output.

In one embodiment, the circuit design can include or specify an initial network. Accordingly, generating a plurality of lossless choice networks can include generating a first lossless choice network from the circuit design according to a first synthesis technique, wherein the first lossless choice network includes the initial network, and generating at least a second lossless choice network from the first lossless choice network, wherein the second lossless choice network includes the initial network and the first lossless choice network.

Generating the first lossless choice network can include adding at least one choice node, specifying a first alternate circuit implementation determined using the first synthesis technique, to the initial network to form the first lossless choice network. Generating the second lossless choice network can include adding at least one choice node, specifying a second alternate circuit implementation determined using the second synthesis technique, to the first lossless choice network to generate the second lossless choice network.

Generating the placement information for each of the plurality of lossless choice networks can include processing each lossless choice network through an analytical placer to generate the placement information. In one embodiment, the computer-implemented method can include generating the plurality of lossless choice networks and generating the placement information for each lossless choice network concurrently. Each of the plurality of lossless choice networks further can be technology mapped prior to placement.

Yet another embodiment of the present invention can include a computer program product including a computer-usable medium having computer-usable program code that, when executed by an information processing system, causes the information processing system to perform the various steps and/or functions disclosed herein.

DETAILED DESCRIPTION OF THE DRAWINGS

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the invention.

The embodiments disclosed herein relate to implementation flows for ICs that incorporate choice networks. More particularly, a circuit design can be processed through multiple synthesis techniques. Each synthesis technique can operate to optimize the circuit design with respect to a particular design objective. For example, one synthesis technique may seek to optimize the circuit design to reduce area usage on the target device, another to reduce power consumption, and another to improve timing. The result of one synthesis technique can be passed to the next in the form of a choice network. From one synthesis technique to the next, the choice network that is passed along comprises all of the alternate circuit implementations that were determined through each successive synthesis process.

Each of the choice networks generated by application of a different synthesis technique can be processed through a placement process that facilitates evaluation of each respective choice network. One of the choice networks can be selected for further processing with respect to the remaining stages of an implementation flow. The placement process provides a more accurate means of selecting a particular choice network as compared to the use of other metrics commonly used to evaluate logical networks.

Figure 1:
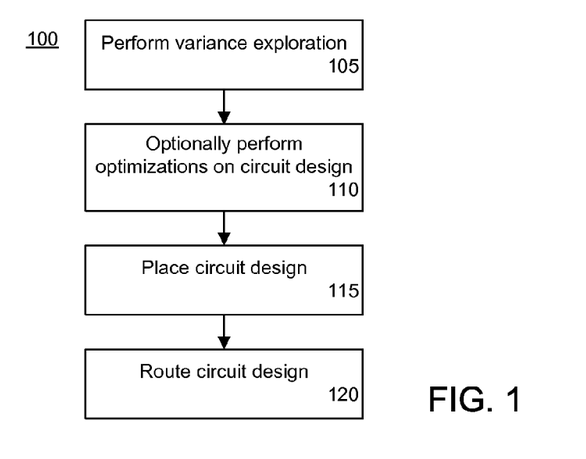
FIG. 1 is a flow chart illustrating a high-level method of implementing a circuit design in accordance with one embodiment of the present invention.

FIG. 1 is a flow chart illustrating a high-level method 100 of implementing a circuit design in accordance with one embodiment of the present invention. More particularly, the method 100 can represent an example of an implementation flow in accordance with an embodiment of the present invention. The method 100 can be implemented within a software-based electronic design automation (EDA) tool executing within one or more suitable data processing systems, e.g., computers, servers, or the like.

The method 100 can begin in step 105, where variance exploration can be performed. Variance exploration can be implemented through the use of lossless synthesis and choice networks that preserve different implementations of a network. In general, "lossless synthesis" refers to the ability to keep transient states of a circuit design during a synthesis phase. These different states, or different circuit implementations, can be stored in a construct called a "choice node." Each choice node can specify a list of functionally equivalent implementations of the network for which different implementation choices can be made. Further information regarding choice networks can be found in "Reducing Structural Bias in Technology Mapping" by Chatterjee et al., ICCAD 2005 and "Improvements to Technology Mapping for LUT-Based FPGAs" by Mishchenko et al., IEEE Transactions on CAD, vol. 26, no. 2, pp. 240-253, February 2007, both of which are fully incorporated herein by reference in their entirety.

As known, a circuit design may be represented as a directed acyclic graph (DAG). In one embodiment, the DAG can be structured as an AND-inverter graph. That is, the circuit design can be represented as a DAG in which nodes represent logical AND gates and edges of the DAG represent inverters. A "choice network" can be implemented in this manner, e.g., as an AND-inverter DAG. A choice network specifies a circuit design as well as one or more alternate circuit implementations, e.g., restructurings, of the circuit design in the form of choice nodes that may be determined from the application of different synthesis techniques.

A "lossless choice network," as used herein, can refer to a choice network that has been processed using a plurality of synthesis techniques and specifies each alternate circuit implementation for the circuit design that has been determined through application of the plurality of synthesis techniques. For example, a lossless choice network that has been processed through three different synthesis techniques will still specify the original network as well as each alternate circuit implementation of the original network that was determined through the application of the three different synthesis techniques.

As noted, different synthesis techniques typically are tailored or optimized with a particular design objective in mind, e.g., area reduction, improved timing, reduced power consumption, or the like. Each of these synthesis techniques will restructure the choice network in a manner that seeks to achieve the goal of that particular synthesis technique. Using choice networks, the circuit design may be processed through a plurality of synthesis processes, with each synthesis process adding alternate implementations to the choice network being operated upon.

Variance exploration also can include technology mapping and placement. For example, the choice network that is generated after each synthesis process can be technology mapped and processed through an analytical placement process. The analytical placement process can provide an indication as to which of the choice networks should be selected for further processing in the implementation flow. Placement information generated by the analytical placement processes, in general, will be more reliable than various other cost metrics used to determine the quality of a logical network with respect to power, timing, area usage, or the like. The placement information generated will be more specific, as it relates to a physical implementation of one or more or all portions of each respective choice network. One of the choice networks can be selected and processed further through the implementation flow.

In step 110, one or more optimizations may be performed on the circuit design after variance exploration. Each of the optimizations may relate to improving a particular metric used by a synthesis technique applied in step 105. Such cost improvements may include one or more area recovery processes, one or more routability improvement processes, one or more power consumption improvement processes, and/or one or more symmetry-based improvement processes. As used herein, a "symmetry-based improvement process" can be one that attempts to increase the number of swappable signals in a circuit design based upon symmetry properties to provide further flexibility and variation that may be achieved through physical synthesis for purposes of exploration of different physical circuit implementations.

In step 115, the circuit design can be placed. It should be appreciated that much of the circuit design can be placed during variance exploration in step 105. Accordingly, in step 115, a detailed placement can be performed. Detailed placement, for example, refers to a placement process during which non-critical circuit components are placed. In step 120, the circuit design can be routed. In the case of an FPGA, for example, the circuit design can be further processed to generate a bitstream that can be loaded into the FPGA to configure the device to implement the circuit design.

Figure 2:
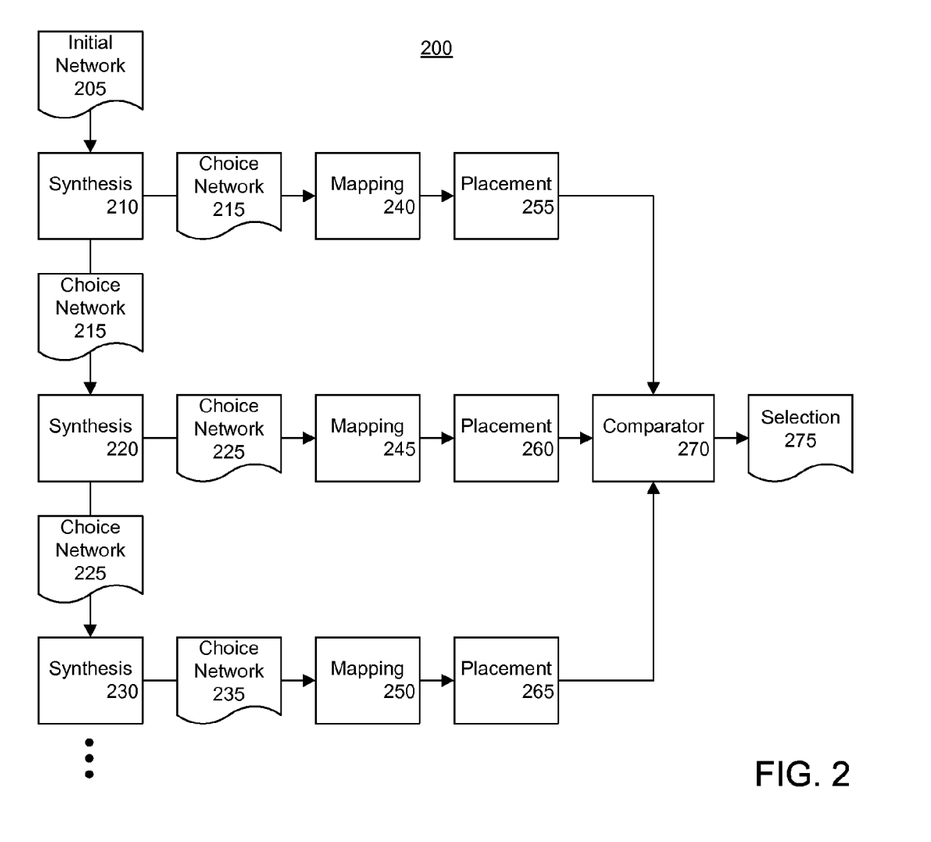
FIG. 2 is a block flow diagram illustrating a method of performing variance exploration in accordance with another embodiment of the present invention.

FIG. 2 is a block flow diagram illustrating a method 200 of performing variance exploration in accordance with another embodiment of the present invention. FIG. 2 presents a more detailed illustration of step 105 as described with reference to FIG. 1. In general, FIG. 2 illustrates how a plurality of different synthesis techniques can be applied to a circuit design, referred to as the "initial network" 205. Each of the synthesis techniques can utilize, for example, a different cost function to restructure the received network graph.

As shown, the initial network 205, which may be an AND-inverter DAG representation of the circuit design, for example, can be provided to a first synthesis technique represented by synthesis block 210. Synthesis block 210 can operate upon the initial network 205 and output a choice network 215. As used herein, "outputting" and/or "output" can mean, for example, writing to a file, writing to a user display or other output device, storing in memory, playing audible notifications, sending or transmitting to another system, exporting, or the like.

Synthesis block 210 can merge any alternate circuit implementations as choice nodes within the initial network 205, thereby creating the choice network 215. Accordingly, the choice network 215 can specify the initial network 205 as well as any alternate circuit implementations determined by synthesis block 210. For example, synthesis block 210 may be configured to optimize the initial network 205 in terms of timing by using a cost function that favors timing over other metrics. Any variation of the initial network 205 may be added to the initial network 205 as a choice node. The choice network 215, in general, can be the initial network 205 along with any choice nodes merged therein or added by synthesis block 210.

Choice network 215, which is output from synthesis block 210, can be provided to synthesis block 220. For example, synthesis block 220 may be configured to optimize the circuit design in terms of power consumption, e.g., utilize a cost function that favors reduction of power consumption over other metrics. Any alternate circuit implementations determined by synthesis block 220 can be added to the choice network 215 as choice nodes, thereby creating choice network 225. Accordingly, the choice network 225 specifies the initial network 205, the choice network 215, as well as the alternate circuit implementations determined by synthesis block 220.

The choice network 225 that is output from synthesis block 220 can be provided to a further synthesis block 230, representing the application of yet a different synthesis technique. Synthesis block 230 can be configured to optimize a circuit design to achieve another design objective, e.g., reduction in area consumed by the circuit design when implemented in the target device. Accordingly, synthesis block 230 can utilize a cost function that relies upon metrics that have been found to reduce area usage on a target device. Any alternate circuit implementations can be added to the choice network 225 as one or more choice nodes to generate choice network 235. The choice network 235 can specify each alternate circuit implementation determined by each respective synthesis technique applied to the circuit design, e.g., as represented by synthesis blocks 210, 220, and 230.

It should be appreciated that each choice network will include variance in terms of achieving different design objectives. For example, choice network 215 may include the initial network and various choices for implementation relating to the design objective of synthesis block 215, e.g., timing. Choice network 225 may include various choices relating to timing as well as choices for implementation relating to the design objective of synthesis block 220, e.g., power consumption. Similarly, choice network 235 will include choices or circuit variations relating to each design objective of the various synthesis processes applied to the circuit design. For example, part of the choice network 235 may include choices relating to timing, while other portions include choices relating to power reduction, and still other portions include choices relating to area reduction.

As shown, after application of each synthesis technique, a choice network can be output and provided to a further synthesis technique and/or provided to a mapping stage. Each choice network 215, 225, and 235 can be provided to a respective mapping block 240, 245, and 250. The mapping blocks, in general, can transform the choice networks specified as AND-inverter graphs into look-up table (LUT) network graphs. This conversion typically is accomplished through a process called "cut enumeration and selection."

Cut enumeration refers to the process of grouping one or more nodes of the AND-inverter graph into different cuts. Each cut can specify or define an instantiation of a logic component, in this case a LUT. Alternate cut sets may be determined from each choice network. Each alternate cut set defines a different arrangement and configuration of logic structures, e.g., LUTs, that may be used for physical implementation of the circuit design. As each choice network includes choice nodes, the alternate cut sets provide potential arrangements of logic structures that are based upon the availability of the different choices specified in each respective choice network.

Once a plurality of cut sets is generated for a given choice network, a particular cut set can be selected for use in technology mapping the circuit design. This process is referred to as "cut selection." Typically, cut sets are evaluated using a cost function. The cost function used for cut selection can account for a variety of different factors, e.g., the level of LUTs resulting in the circuit design, the overall number of LUTs, the area needed to implement each cut set within the target device, timing, and the like. Computing a value of the cost function for each cut set yields an estimate of the "goodness" of each cut set. The cut set having the highest measure of goodness can be selected for use in technology mapping the choice network.

There are a variety of known techniques for performing cut enumeration and selection. For example, the following references, each of which is fully incorporated herein by reference, discuss cut enumeration and/or cut selection: "DAOmap: A Depth-Optimal Area Optimization Mapping Algorithm for FPGA Designs," by D. Chen et al., ICCAD (November 2004) and "Improvements to Technology Mapping for LUT-Based FPGAs," by A. Mishchenko et al., IEEE Transactions on CAD, vol. 26, no. 2, pp. 240-253 (February 2007). The particular cut enumeration and/or cut selection techniques noted above are provided for purposes of illustration only and are not intended to limit the embodiments disclosed herein. It should be appreciated that the embodiments disclosed herein may be used independently and/or in combination with one or more other cut enumeration and/or cut selection techniques. In other embodiments, other cut enumeration and/or cut selection techniques may be used, to the exclusion of those techniques noted above.

Thus, mapping block 240 can technology map choice network 215 through cut enumeration and selection. Similarly, mapping block 245 can technology map choice network 225. Mapping block 250 can technology map choice network 235. The technology mapped choice networks can be placed. Mapping block 240 can output technology mapped choice network 215 to placement block 255. Mapping block 245 can output technology mapped choice network 225 to placement block 260. Mapping block 250 can output technology mapped choice network 235 to placement block 265.

Each of placement blocks 255, 260, and 265 can represent, or be implemented as, an analytical placer that can be used to place each received choice network. Each placement block 255, 260, and 265 can determine physical locations on the target device for each component determined through technology mapping. Analytical placers typically place circuit designs by trying to minimize the overall wire length of the circuit design. Often, a quadratic representation is used, where the sum of the squares of the wire lengths is optimized. Analytical placers can utilize fast, matrix computation techniques to achieve a solution. These techniques may be scaled for larger circuit designs. Analytical placers provide an initial placement solution for a circuit design that may be further optimized later in the implementation flow, e.g., during a detailed placement and/or routing phase.

Each placement block 255, 260, and 265 can generate and output timing information and routability information as the entirety of each choice network that is placed is evaluated. The timing and routability information, e.g., a score or raw data, may be evaluated or compared by the comparator 270. The comparator 270 can select a given choice network and corresponding technology mapping and placement for further processing in the implementation flow. The selected choice network can be output as selection 275. The selection of a particular choice network can be made according to a cost function that may depend upon one or more metrics relating to timing, power consumption, area usage, or the like. The information generated by each placement block will, in general, be more reliable than metrics used to evaluate a purely logical network without technology mapping and/or placement information being specified.

In one embodiment, each synthesis, mapping, and placement phase relating to a given choice network can be performed in parallel. In illustration, when the choice network 215 is output from synthesis block 210, synthesis block 220, mapping block 245, and placement block 260 can begin execution. The execution of blocks 220, 245, and 260 can be parallel and concurrent with mapping block 240 and placement block 255. Similarly, when choice network 225 is output from synthesis block 220, execution of synthesis block 230, mapping block 250, and placement block 265 can begin, which may overlap with one or more of the aforementioned processes. Each process relating to a given choice network, for example, may be implemented within a different thread of execution within a data processing system.

It should be appreciated that by passing choice networks from one synthesis process to another, efficiencies can be gained that decrease overall execution time. That is, each synthesis process will have access to the memory of the preceding synthesis process. The runtime for each synthesis process can be reduced, thereby reducing the total runtime of the implementation flow as compared to performing a plurality of serial implementation flows from scratch. Accordingly, the time needed to explore alternate circuit implementations using a technique as illustrated in FIG. 2 can provide significant time savings as compared to performing multiple iterations of a conventional, serial implementation flow.

In illustration, in a conventional implementation flow where alternatives are evaluated, the circuit design is compiled through a hardware description language (HDL) compiler. After HDL compilation, the results are further processed, e.g., "cleaned-up" to remove redundancy, and validated, e.g., target component validation and retargeting from one family of component to the next. At that point, a synthesis technique can be applied. The results then can be placed and routed. For each different alternative to be explored, the entire process, e.g., compilation, clean-up, validation, synthesis, place, and route, is performed using a different synthesis technique for each repetition. In the embodiments disclosed herein, compilation, clean-up, and validation need only be performed one time. Multiple synthesis techniques can be applied, where each synthesis technique can utilize the same compilation, clean-up, and validation results.

The parallel fashion in which the method illustrated in FIG. 2 is performed allows variance of the circuit design to be explored in an efficient manner. Further, by cumulatively adding variation to choice networks as the process continues, the need for feedback from one process to another is not needed. Feedback is not needed as no alternate implementation of the circuit design is lost from one synthesis process to the next. Without the need for feedback, the implementation flow can be performed one time, where variance exploration is performed as described as opposed to performing multiple implementation flows with synthesis being performed from the ground up each time, possibly including feedback from a prior implementation flow or recursively performing synthesis with the aid of feedback information from placement or routing.

Figure 3:
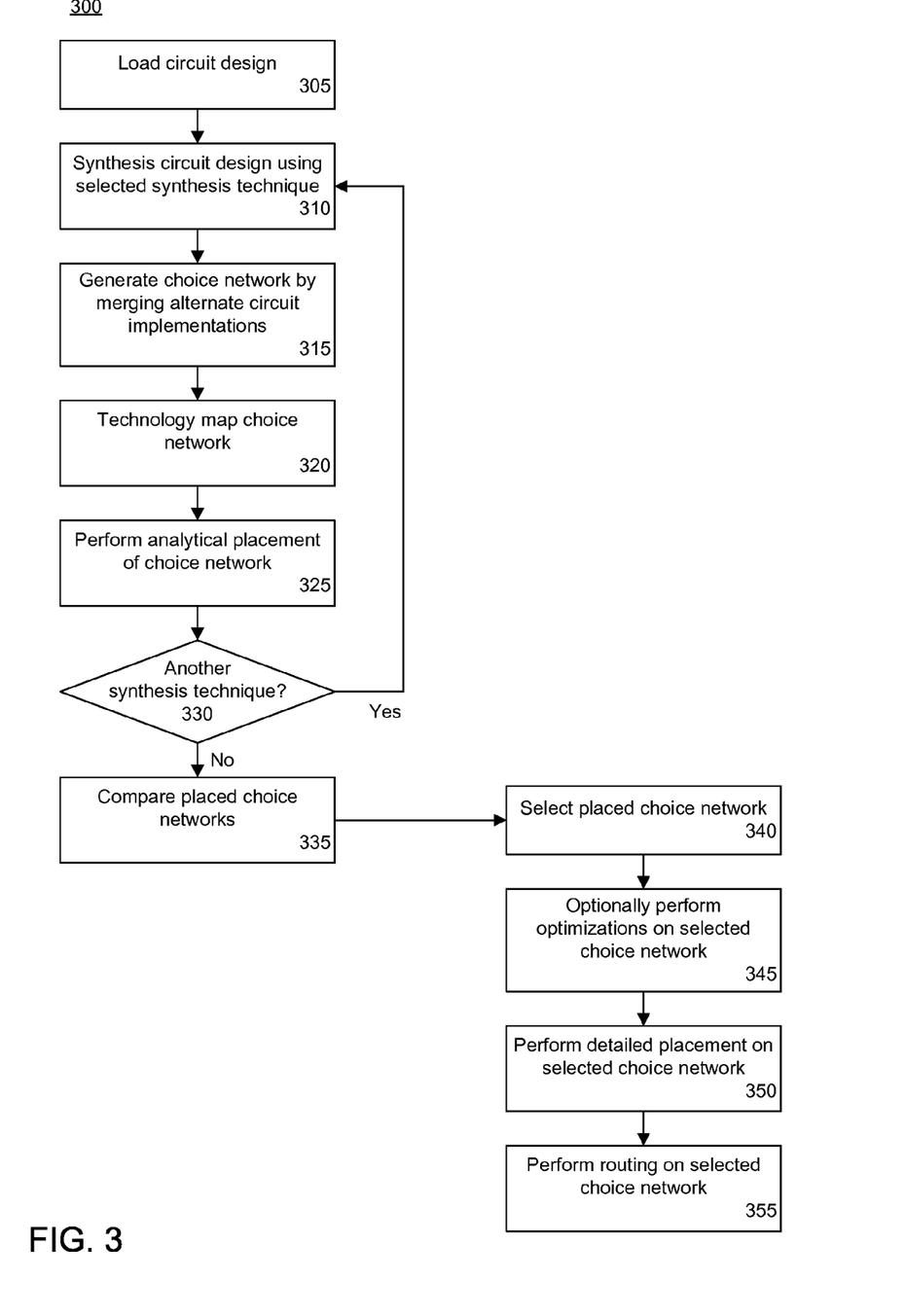
FIG. 3 is a flow chart illustrating a method of implementing a circuit design in accordance with another embodiment of the present invention.

FIG. 3 is a flow chart illustrating a method 300 of implementing a circuit design in accordance with another embodiment of the present invention. The method 300 can be performed by an EDA or other circuit design tool executing within one or more data processing systems. In step 305, a circuit design can be loaded. The circuit design may be specified in programmatic form, for example, as one or more hardware description language files which may be converted to an AND-inverter type of DAG, or the like.

In step 310, the circuit design can be synthesized using a selected synthesis technique. The synthesis technique can process the circuit design, e.g., the network graph, using a cost function that favors a particular objective, e.g., timing, power consumption reduction, area reduction, reduction in the number of logic stages in the circuit design, or the like. In step 315, the synthesis technique can generate a choice network by merging any alternate circuit implementations determined through application of the synthesis technique of step 310 into the circuit design. As noted, each alternate circuit implementation can be added to the circuit design (choice network) as a choice node. Thus, the output from the synthesis process can be a lossless choice network including one or more choice nodes.

In step 320, the choice network can be technology mapped. In step 325, the technology mapped choice network can be analytically placed. In step 330, a determination can be made as to whether any further synthesis techniques are to be applied to the circuit design. If so, the method can loop back to step 310, where the choice network generated during a prior iteration can be further synthesized using a different synthesis technique. If no further synthesis techniques are to be applied to the choice network, the method can proceed to step 335.

In step 335, the different placed, choice networks can be compared using a cost function. A value of the cost function can be computed for each choice network according to the placement information generated for that choice network. The highest scoring choice network can be selected in step 340 and output. In step 345, the selected choice network can be further optimized if so desired. In step 350, a detailed placement can be performed on the selected choice network. In step 355, the choice network can be routed. The resulting circuit design, as specified by the placed and routed choice network, can be output.

It should be appreciated that although analytical placement may provide "fast" placement results, such results may not be as comprehensive as those obtained from performing a full place and route process. As shown, full, e.g., detailed, place and route is performed one time upon the selected choice network in step 350. Within conventional implementation flows, as noted, place and route are performed each time the implementation flow is repeated, e.g., upon each alternative circuit design implementation that is generated and evaluated. By not performing full place and route multiple times, reduced runtime can be achieved.

For purposes of illustration, the flow chart has been described in a serial manner with respect to synthesis, technology mapping, and analytical placement. The loop including steps 310-330, however, may be performed such that each iteration of the loop is executed in a different execution thread of a data processing system. In that regard, multiple iterations of the loop of steps 310-330 may be performed concurrently, e.g., in parallel, or overlap as described herein.

The flowcharts in the figures illustrate the architecture, functionality, and operation of possible implementations of systems, methods and computer program products according to various embodiments of the present invention. In this regard, each block in the flowcharts may represent a module, segment, or portion of code, which comprises one or more portions of computer-usable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and computer instructions.

Embodiments of the present invention can be realized in hardware, software, or a combination of hardware and software. The embodiments can be realized in a centralized fashion in one data processing system, e.g., computer system, or in a distributed fashion where different elements are spread across several interconnected data processing systems. Any kind of computer system or other apparatus adapted for carrying out the methods described herein is suited. A typical combination of hardware and software can be a general-purpose computer system with a computer program that, when being loaded and executed, controls the computer system such that it carries out the methods described herein.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the currently available types of network adapters.

Embodiments of the present invention further can be embedded in a computer program product, which comprises all the features enabling the implementation of the methods described herein. The computer program product can include a computer-usable or computer-readable medium having computer-usable program code which, when loaded in a computer system, causes the computer system to perform the functions described herein. Examples of computer-usable or computer-readable media can include, but are not limited to, optical media, magnetic media, computer memory, one or more portions of a wired or wireless network through which computer-usable program code can be propagated, or the like.

The terms "computer program," "software," "application," "computer-usable program code," variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, although not necessarily directly, and not necessarily mechanically, e.g., communicatively linked through a communication channel or pathway or another component or system.

The embodiments disclosed herein can be embodied in other forms without departing from the spirit or essential attributes thereof. Accordingly, reference should be made to the following claims, rather than to the foregoing specification, as indicating the scope of the various embodiments of the present invention.

The invention claimed is:

1. A method of implementing a circuit design, wherein the circuit design comprises an initial network, the method comprising:
   generating a first choice network, using a processor, from the circuit design according to a first synthesis technique;
   wherein the first choice network specifies a plurality of first alternative circuit implementations for the circuit design determined using the first synthesis technique;
   determining a placement for the first choice network;
   generating at least a second choice network from the first choice network according to a second synthesis technique;
   wherein the second choice network specifies a plurality of second alternative circuit implementations for the circuit design determined using the second synthesis technique;
   determining a placement for the second choice network;
   comparing the placement for the first choice network with the placement for the second choice network; and
   selecting a choice network according to the comparison.

2. The method of claim 1, wherein each first alternative circuit implementation for the circuit design of the first choice network is generated in accordance with a first design objective implemented by the first synthesis technique; and
   wherein each second alternative circuit implementation of the second choice network is generated in accordance with a second design objective implemented by the second synthesis technique.

3. The method of claim 1, further comprising performing a detailed placement upon the selected choice network.

4. The method of claim 1, further comprising preventing information generated by a process of an implementation flow from being used during a repetition of a prior process of the implementation flow.

5. The method of claim 1, wherein generating at least a second choice network from the first choice network according to a second synthesis technique comprises adding at least one choice node to the first choice network;
   wherein the at least one choice node specifies at least one of the plurality of second alternative circuit implementations for the circuit design determined using the second synthesis technique.

6. The method of claim 1, wherein the first synthesis technique and the second synthesis technique each is a lossless synthesis technique in which transient states of the circuit design are stored as the alternative circuit implementations for each respective synthesis technique.

7. The method of claim 1, wherein generating the first choice network comprises adding at least one of the plurality of first alternate circuit implementations to the initial network as a choice node.

8. The method of claim 7, wherein generating the second choice network comprises adding at least one of the plurality of second alternate circuit implementations to the first choice network as a choice node.

9. A method of implementing a circuit design, the method comprising:
   generating a plurality of lossless choice networks;
   wherein each lossless choice network specifies a plurality of functionally equivalent and different alternate circuit implementations generated using a different synthesis technique having a different design objective;
   generating placement information for each of the plurality of lossless choice networks;
   comparing, using a processor, the placement information for each of the plurality of lossless choice networks; and
   selecting one of the lossless choice networks according to the placement information.

10. The method of claim 9, wherein the circuit design comprises an initial network, wherein generating a plurality of lossless choice networks comprises:
    generating a first lossless choice network from the circuit design according to a first synthesis technique having a first design objective, wherein the first lossless choice network comprises the initial network; and
    generating at least a second lossless choice network from the first lossless choice network according to a second synthesis technique having a second and different design objective, wherein the second lossless choice network comprises the initial network and the first lossless choice network.

11. The method of claim 10, wherein:
    generating the first lossless choice network comprises adding at least one choice node, specifying a first plurality of alternate circuit implementations determined using the first synthesis technique, to the initial network to form the first lossless choice network; and
    generating the second lossless choice network comprises adding at least one choice node, specifying a second plurality of alternate circuit implementations determined using the second synthesis technique, to the first lossless choice network to generate the second lossless choice network.

12. The method of claim 11, wherein the first synthesis technique and the second synthesis technique each is a lossless synthesis technique in which transient states of the circuit design are stored as the alternative circuit implementations for each respective synthesis technique.

13. The method of claim 9, further comprising generating the plurality of lossless choice networks and generating the placement information for each lossless choice network concurrently.

14. The method of claim 9, further comprising technology mapping each of the plurality of lossless choice networks prior to placement.

15. A computer program product, comprising:
a non-transitory computer-usable medium having computer-usable program code that implements a circuit design, the computer-usable medium comprising:
computer-usable program code that generates a plurality of lossless choice networks;
wherein each lossless choice network specifies a plurality of functionally equivalent and different alternate circuit implementations generated using a different synthesis technique having a different design objective;
computer-usable program code that generates placement information for each of the plurality of lossless choice networks;
computer-usable program code that compares the placement information for each of the plurality of lossless choice networks; and
computer-usable program code that selects one of the lossless choice networks according to the placement information.

16. The computer program product of claim 15, wherein the circuit design comprises an initial network, wherein the computer-usable program code that generates a plurality of lossless choice networks comprises:
computer-usable program code that generates a first lossless choice network from the circuit design according to a first synthesis technique having a first design objective, wherein the first lossless choice network comprises the initial network; and
computer-usable program code that generates at least a second lossless choice network from the first lossless choice network according to a second synthesis technique having a second and different design objective, wherein the second lossless choice network comprises the initial network and the first lossless choice network.

17. The computer program product of claim 16, wherein:
the computer-usable program code that generates the first lossless choice network comprises computer-usable program code that adds at least one choice node, specifying a first plurality of alternate circuit implementations determined using the first synthesis technique, to the initial network to form the first lossless choice network; and
the computer-usable program code that generates the second lossless choice network comprises computer-usable program code that adds at least one choice node, specifying a second plurality of alternate circuit implementations determined using the second synthesis technique, to the first lossless choice network to generate the second lossless choice network.

18. The computer program product of claim 16, wherein the first synthesis technique and the second synthesis technique each is a lossless synthesis technique in which transient states of the circuit design are stored as the alternative circuit implementations for each respective synthesis technique.

19. The computer program product of claim 15, wherein the computer-usable medium further comprises computer-usable program code that generates the plurality of lossless choice networks and generates the placement information for each lossless choice network concurrently.

20. The computer program product of claim 15, wherein the computer-usable medium further comprises computer-usable program code that technology maps each of the plurality of lossless choice networks prior to placement.

* * * * *